(12) United States Patent
Stout

(10) Patent No.: US 6,756,644 B2
(45) Date of Patent: Jun. 29, 2004

(54) ULTRA LOW QGD POWER MOSFET

(75) Inventor: Jonathan Stout, Murrieta, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/104,508

(22) Filed: Mar. 21, 2002

(65) Prior Publication Data
US 2002/0140042 A1 Oct. 3, 2002

Related U.S. Application Data

(60) Provisional application No. 60/279,800, filed on Mar. 28, 2001.

(51) Int. Cl.[7] ............................................... H01L 29/76
(52) U.S. Cl. ....................................... 257/386; 257/389
(58) Field of Search .................................. 257/341, 386

(56) References Cited

U.S. PATENT DOCUMENTS 6,046,473 A * 4/2000 Blanchard .................... 257/341
6,087,697 A * 7/2000 Patel ........................... 257/329
6,589,830 B1   7/2003 Zeng

FOREIGN PATENT DOCUMENTS

EP           050 773      * 5/1982

* cited by examiner

Primary Examiner—Douglas Wille
(74) Attorney, Agent, or Firm—Ostrolenk, Faber Gerb & Soffen, LLP

(57) ABSTRACT

A MOSFET gate electrode is interrupted from extending across a common conduction region, thereby reducing gate capacitance. The reduced gate capacitance provides very low gate-to-drain charge, $Q_{GD}$, and very low gate-to-source charge, $Q_{GS}$. The gate electrode is supported by and is in effect or is actually interrupted by an oxide block over a common conduction area. The MOSFET can be formed by methods including: patterning oxide blocks on a substrate; providing gate electrode material in and over appropriate gaps between the oxide blocks; removing excess gate material; and forming oxide layers around the gate electrode material. Oxide blocks can alternately be patterned to permit gate electrodes to be formed directly between the oxide blocks. The reduced gate capacitance reduces switching delays while permitting minimum $R_{DSON}$ values.

11 Claims, 11 Drawing Sheets

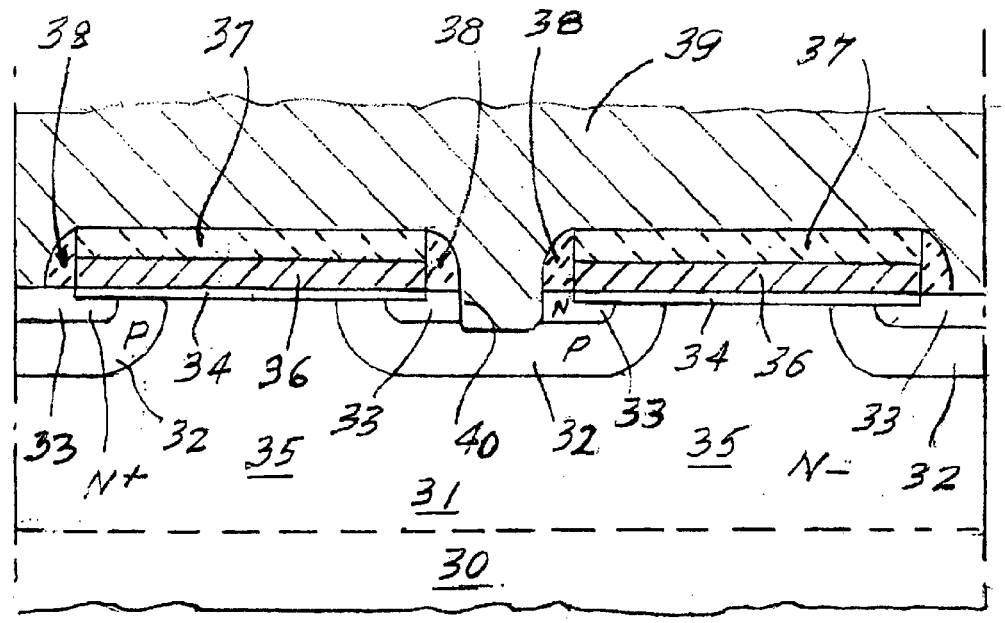
FIG. 1 - PRIOR ART
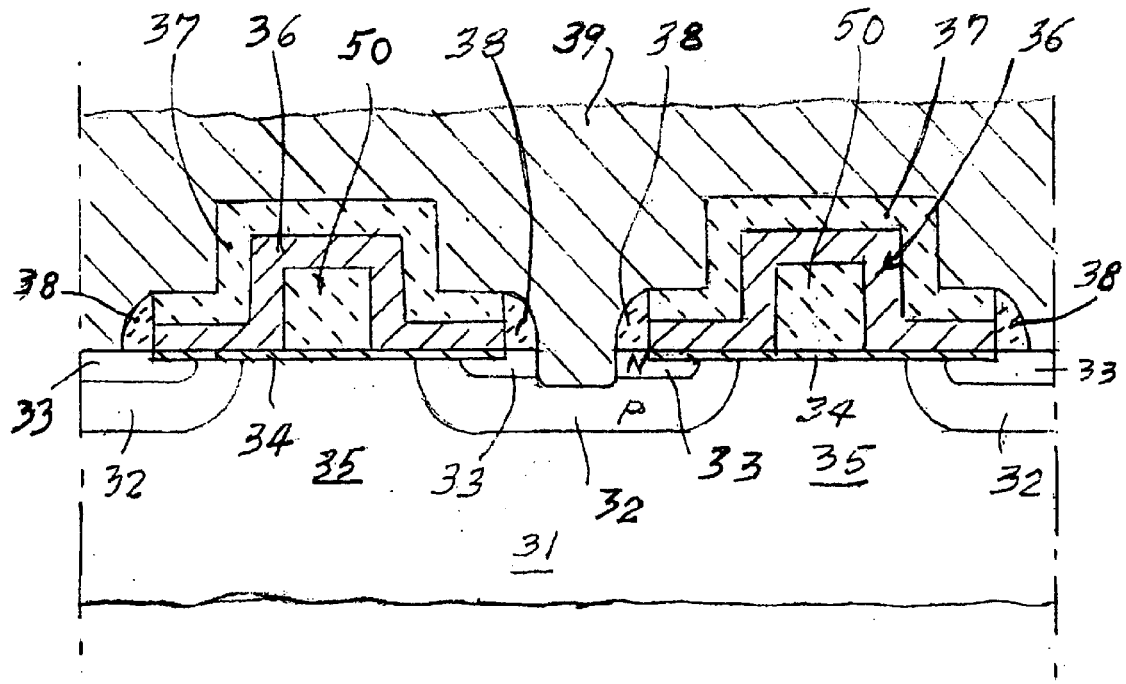
FIG. 2

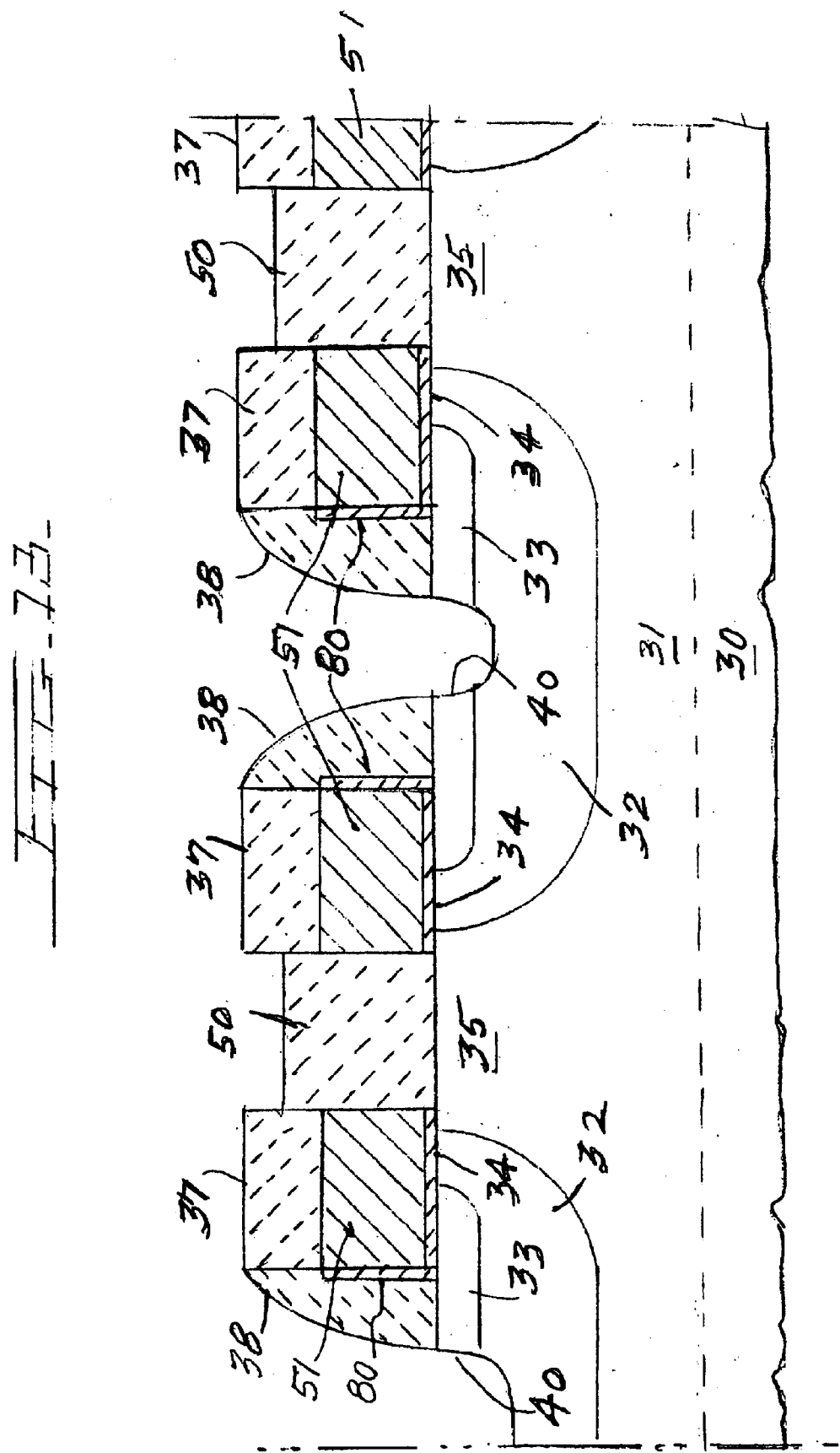

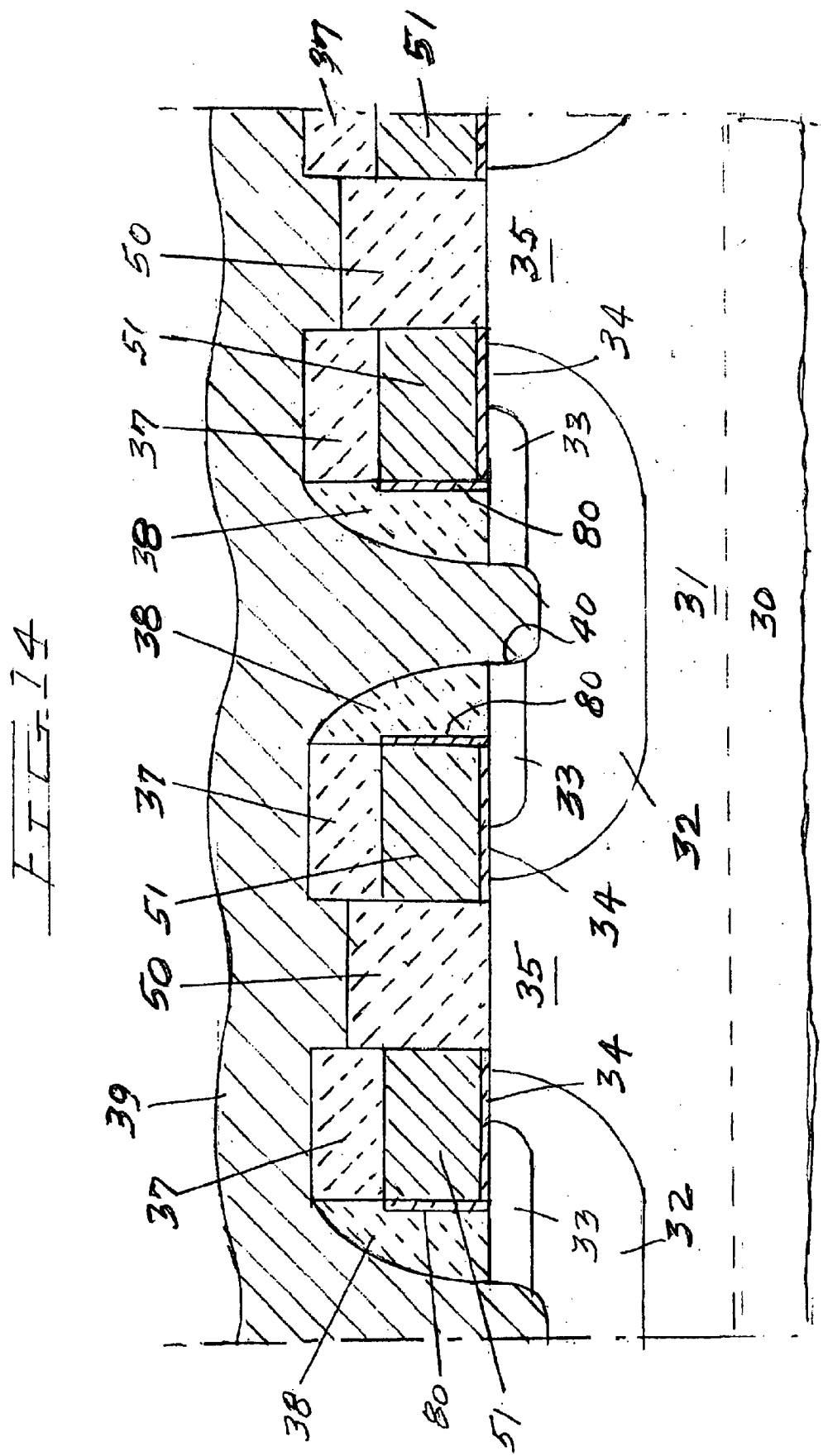

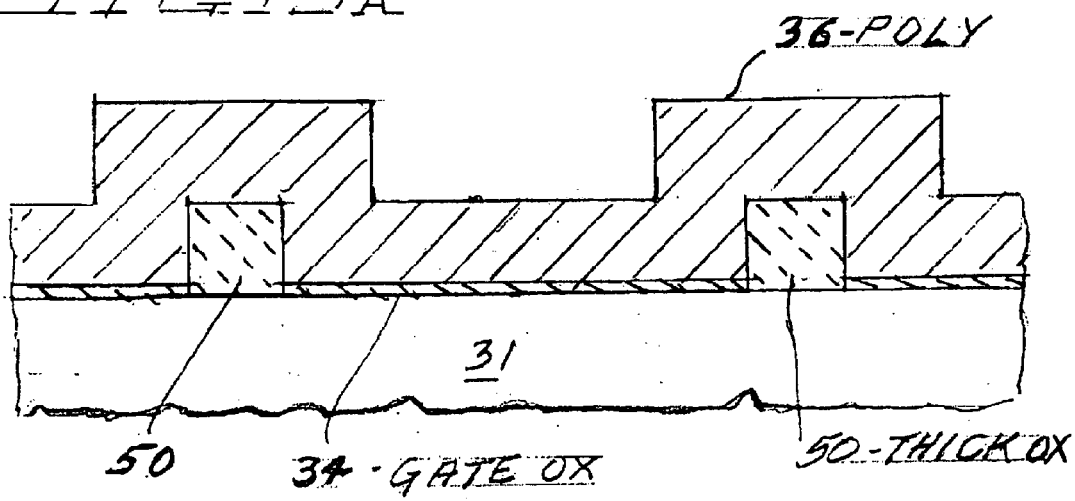
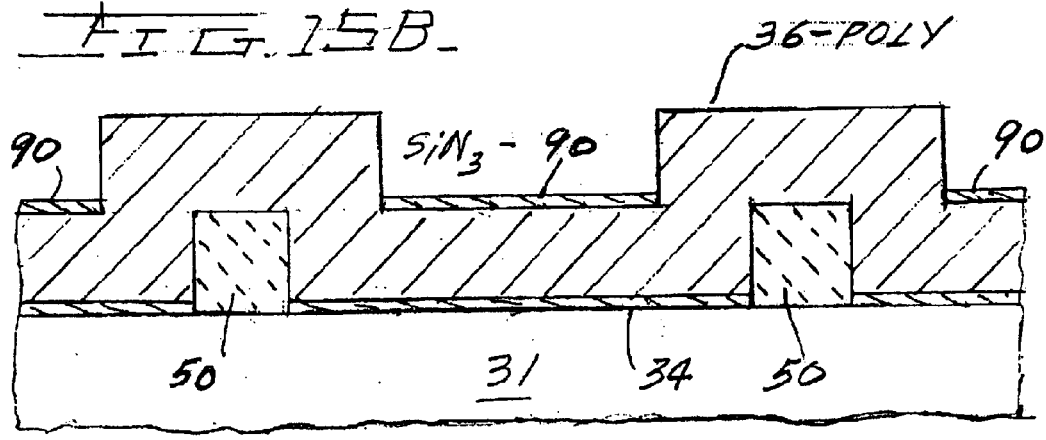
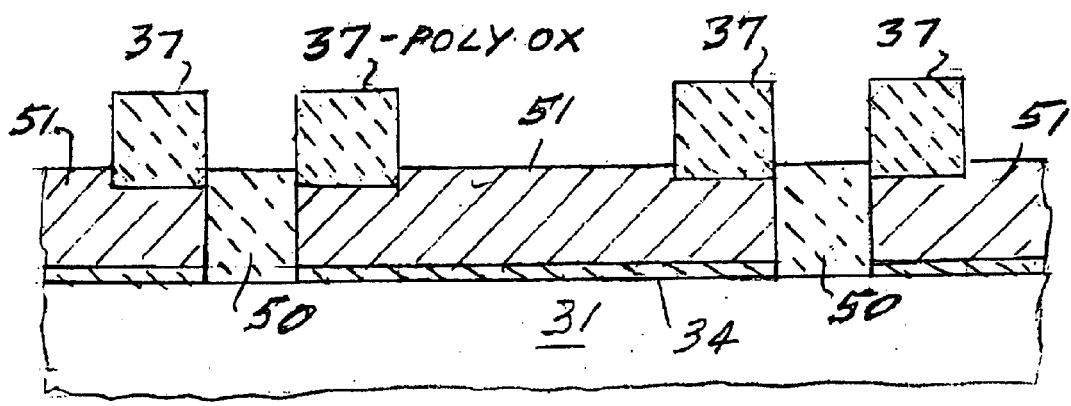

US 6,756,644 B2

ULTRA LOW QGD POWER MOSFET

RELATED CASES

This application is based upon and claims benefit of Provisional Application No. 60/279,800 filed Mar. 28, 2001, to which a claim of priority is hereby made.

FIELD OF THE INVENTION

This invention relates to semiconductor devices and more specifically relates to a MOSFET having an ultra low gate to drain and gate to source capacitance and thus ultra low charges $Q_{GD}$ and $Q_{GS}$.

BACKGROUND OF THE INVENTION

Very high speed power MOSFETs preferably have a minimized product of $Q_G$ and $R_{DSON}$. To accomplish this minimal value, the value of the gate to drain capacitance should be minimized. Further, it is desired to have good immunity against dv/dt conditions and, for this purpose, a small ratio of $Q_{GD}/Q_{GS}$ is desired, to produce good Cdv/dt immunity. It is also desired to provide a minimum $R_{DSON}$ and a low gate poly resistance, and in the manufacturing process, a minimum number of mask steps.

BRIEF DESCRIPTION OF THE INVENTION

In accordance with the invention, a greatly thickened oxide is disposed above the common conduction region or accumulation region between spaced bases of a vertical conduction planar power MOSFET having a cellular or striped base configuration. By increasing the spacing between the polysilicon gate and the drain surfaces over a substantial portion of their facing areas, the capacitance between the gate to the drain is substantially reduced. The ratio of $Q_{GD}/Q_{GS}$ is also substantially reduced, producing excellent Cdv/dt immunity.

BRIEF DESCRIPTION OF THE DRAWINGS

FIG. 1 shows a cross-sectional view of a small portion of a planar vertical conduction power MOSFET of the prior art.

FIG. 2 shows a first embodiment of the present invention in which a thickened oxide is provided over the accumulation region of the structure of FIG. 1 and is an ultra low $Q_{GD}$ self-aligned SAC (Self Aligned Contact) MOSFET.

FIGS. 5 to 14 show the process steps for the manufacture of a dual spacer SAC MOSFET.

FIGS. 15A to 15C show a still further process flow in accordance with the invention.

DETAILED DESCRIPTION OF THE PREFERRED EMBODIMENTS

Figure 3:
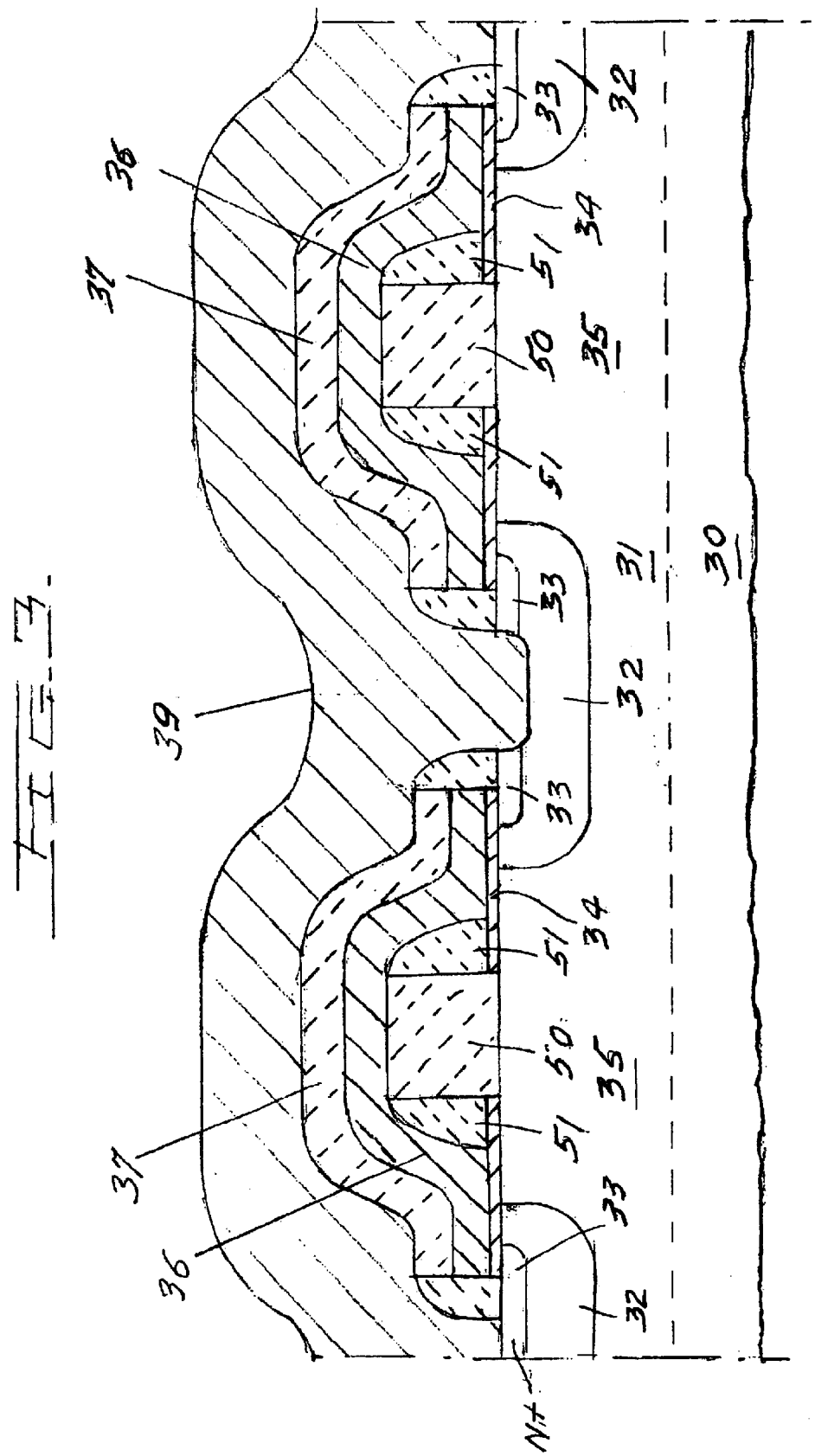
FIG. 3 is a cross-section of a low $Q_{GD}$ SAC MOSFET like that of FIG. 2.

Referring first to FIG. 1, there is shown a cross-section of a few cells (or stripes) of a conventional vertical conduction power MOSFET (that is, a MOSFET in which the current flows vertically across at least a portion of a chip or die, usually to a bottom drain electrode). The numerals used in the following are duplicated in the drawings to identify similar parts.

The well-known device usually employs a silicon substrate 30 having a junction-receiving epitaxially deposited layer 31. Layers 30 and 31 are of the $N^+$ and $N^-$ concentration types, for an N channel device. All concentration types can be reversed for a P channel device. The typical device will usually have a plurality of spaced P bases (or channel regions) 32 which each receive an $N^+$ shallow source region 33 to define invertible P channel regions between the end boundaries of the $N^+$ source and P base. The spaced P channel regions 32 may be connected at the portions of their extent, such as at the ends of P type base stripes.

A thin gate oxide 34 overlies the invertible P channels and the top of the $N^-$ accumulation regions (or "common conduction" regions) 35. A conductive polyox layer 36 overlies the gate oxide layers 34 and is insulated by a polysilicon layer 37 and by oxide SAC spacers 38 from a top (source) metal contact 39 which may be aluminum or some other suitable top metal. Usually, the edge of the polysilicon elements (or lattice, if a cellular geometry is used) define the diffusion windows for bases 32 and sources 33. Spacers 38 define a self-aligned window for the etching of shallow trenches 40 through sources 33 and into bases 32. Trenches 40 are filled with conductive metal during the formation of top contact 39, which makes contact with both sources 33 and bases 32.

The gate to drain capacitance of the device of FIG. 1 is related to the area of poly gate segments 36 over the drain and to the thickness of thin oxide 34, which may be in the range of about 500 Å to 1000 Å. This capacitance defines the gate charge $Q_{GD}$ which, for MOSFETs in certain applications, should be as small as possible.

The present invention provides a novel structure for drastically reducing the charge $Q_{GD}$. Thus, as shown in FIG. 2, a greatly thickened oxide mass or block 50 is formed over a substantial portion of the width of common conduction region 35. For example, oxide block 50 can have a height of about 0.5 micron, which is drastically larger than the thickness of gate oxide 34 (less than 1000 Å). The width of spacer oxide block 50 covers at least more than one-half of the width of regions 35, and preferably as great as possible a portion of their width without interference with the processing tolerance of the wafer processing equipment.

It can be seen in FIG. 2 that the oxide blocks 50 elevate the conductive polysilicon layers 36 away from the surface of the silicon, and also reduce the area of the polysilicon which overlies the surface of regions 35. The conductive polysilicon layers 36 form gate electrodes that interact with opposing invertible channels with which the electrodes are paired. The gate electrodes do not interact with the common conduction areas between the base regions because of the separation caused by the oxide blocks 50. Thus, the gate to drain capacitance is greatly reduced, thereby reducing $Q_{GD}$.

A number of novel process sequences may be used to form the thickened oxide spacers 50, as will be described. Further, polysilicon spacers 51 can be employed on the sides of oxide blocks 50 as shown in FIG. 3, and a dual block structure using both the oxide block 50 and a SAC oxide block 38 can be employed as shown in FIG. 4.

Figure 4:
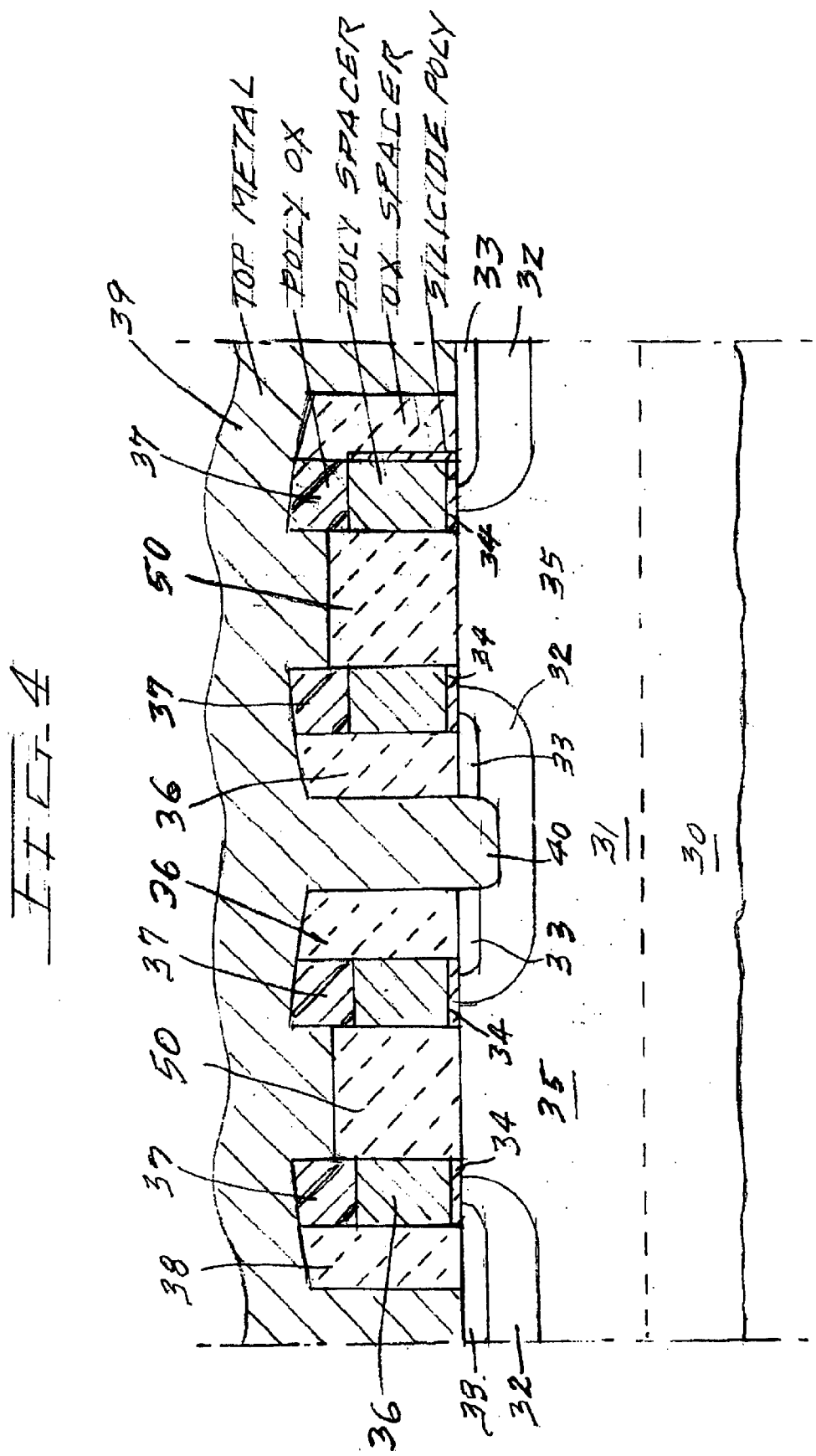
FIG. 4 is a cross-section of a further embodiment of this invention employing a dual spacer design of a polysilicon spacer and an insulation SAC spacer.

The device shown in FIG. 4 has a number of benefits over the prior art structure of FIG. 1. Thus, the device has:

A near zero $Q_{GD}$.

A lower $Q_{GS}$ (gate to source charge).

The ratio of $Q_{GD}/Q_{GS}$ is very small, producing excellent Cdv/dt immunity.

Ultra low $R_{DSON}$ through the use of shallow channel junctions (for example, 0.5 to 0.6 µm compared to the presently used 0.9 µm) and a smaller cell pitch.

A low $R_G$ (gate resistance) if an optional silicide on the polysilicon is employed.

No added mask steps are needed.

Figure 5:
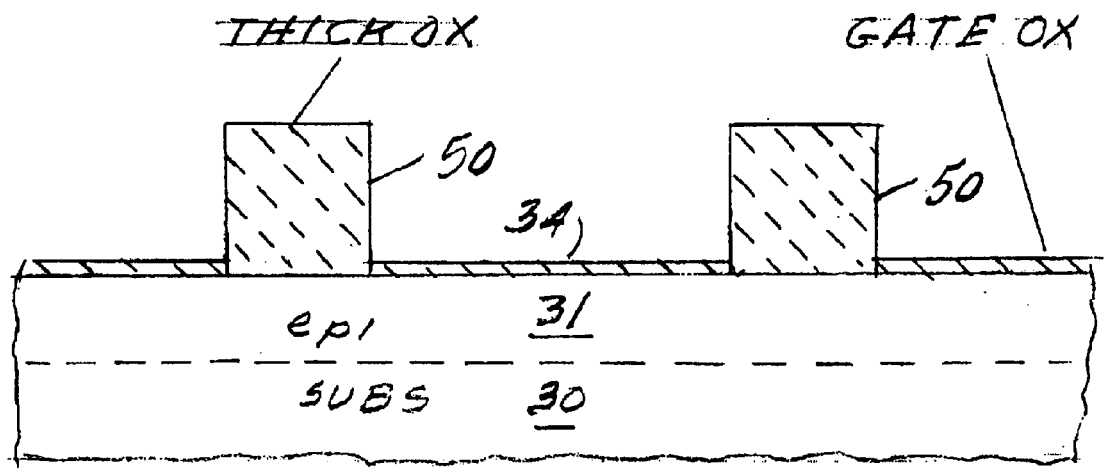

FIGS. 5 to 14 show the main process steps used to manufacture the dual spacer structure of FIG. 4. The initial step, shown in FIG. 5, is the growth or deposition of a thick oxide block 50 on the upper surface of epitaxially deposited layer 31. Oxide 50 may be 0.5 micron thick, as an example. The oxide layer 50 is then patterned and etched, leaving spaced oxide blocks 50, shown in FIG. 5, and a thin gate oxide layer 34 is grown on the silicon surface exposed between spaced oxide blocks 50.

Figure 6:
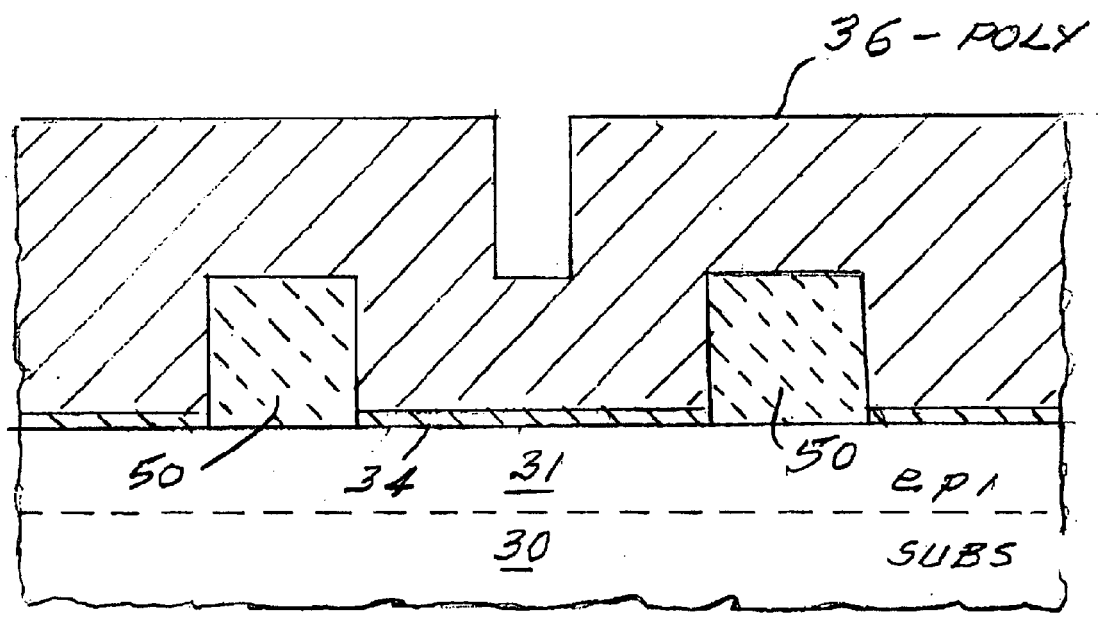
Figure 7:
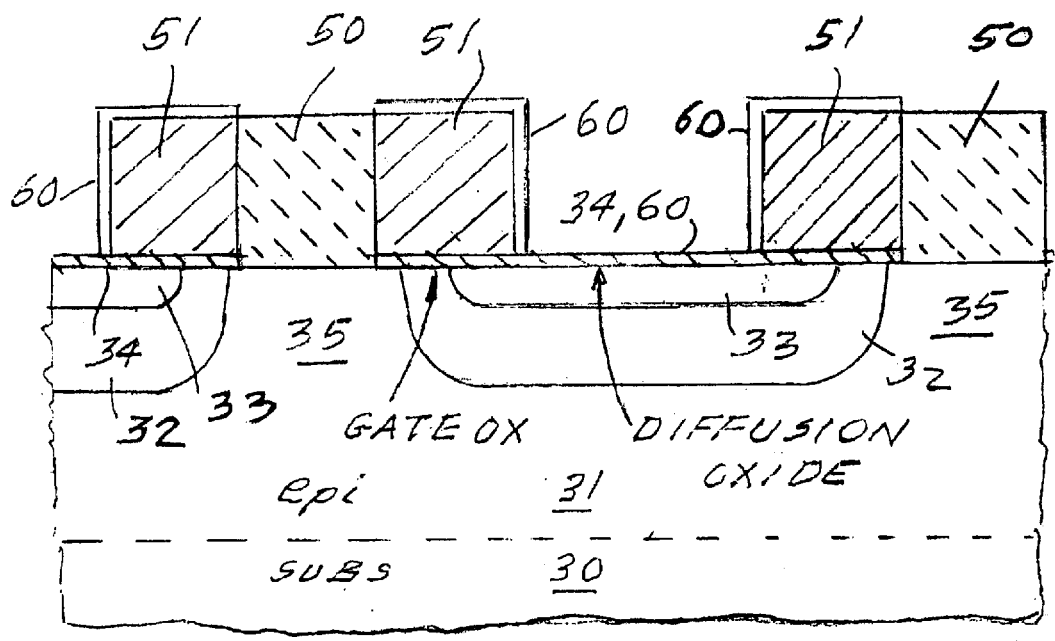

Thereafter, and as shown in FIG. 6, a layer 36 of polysilicon is deposited atop the surface of FIG. 5 and a POCl deposition and diffusion is carried out to make the polysilicon N type, and conductive. The top surface is then deglassed and, as shown in FIG. 7, the polysilicon is patterned and etched to define separated spacers 51 on the sides of oxide blocks 50. The gate pad and gate bus poly (not shown) is protected during this etch, which may be a wet or a dry etch.

It should be noted that the polysilicon 36 may be processed using a CMP process (chemical mechanical polishing) to define spacers 51 in FIG. 7.

Suitable implants and diffusions are then carried out to define a conventional double diffused shallow base or channel regions 32 and self-aligned source regions 33. A thin oxide layer 60 (source oxide) grows over polysilicon spacers 51 at this time.

Figure 8:
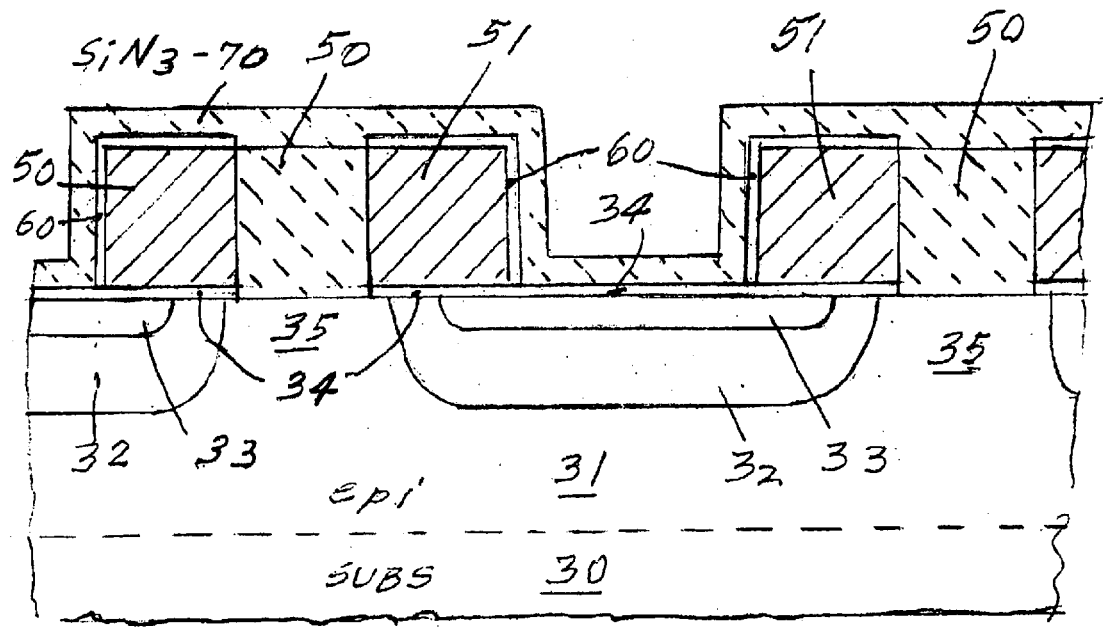
Figure 9:
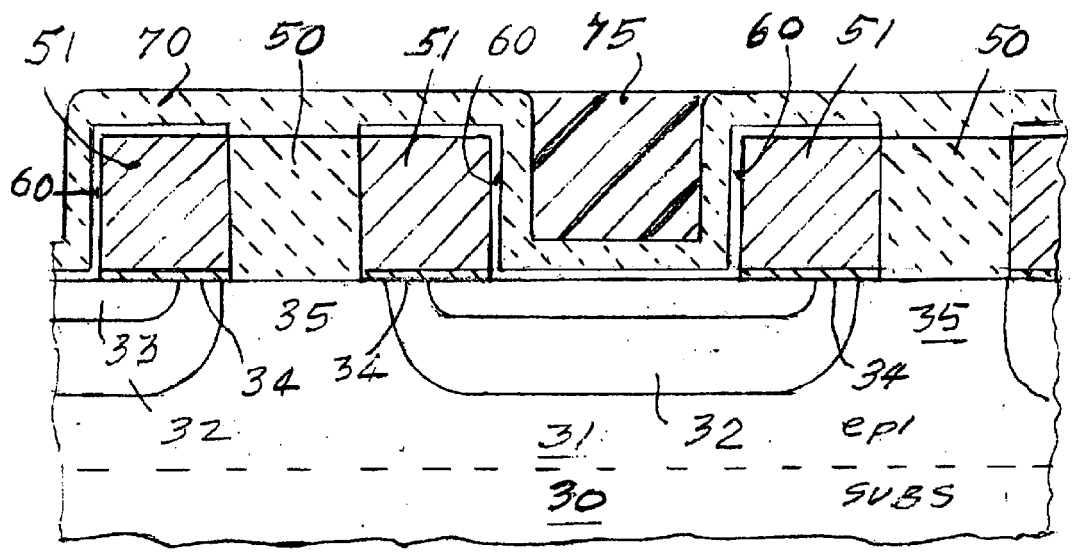

As next shown in FIG. 8, a thin oxidation blocking layer 70, which may be a nitride, is deposited atop the die surface and over oxide layer 60. The gap above the central portion of sources 33 is then filled with an etch protectant, such as a photoresist 75 (FIG. 9) and the upper surface receives a short etch to remove excess photoresist.

Figure 10:
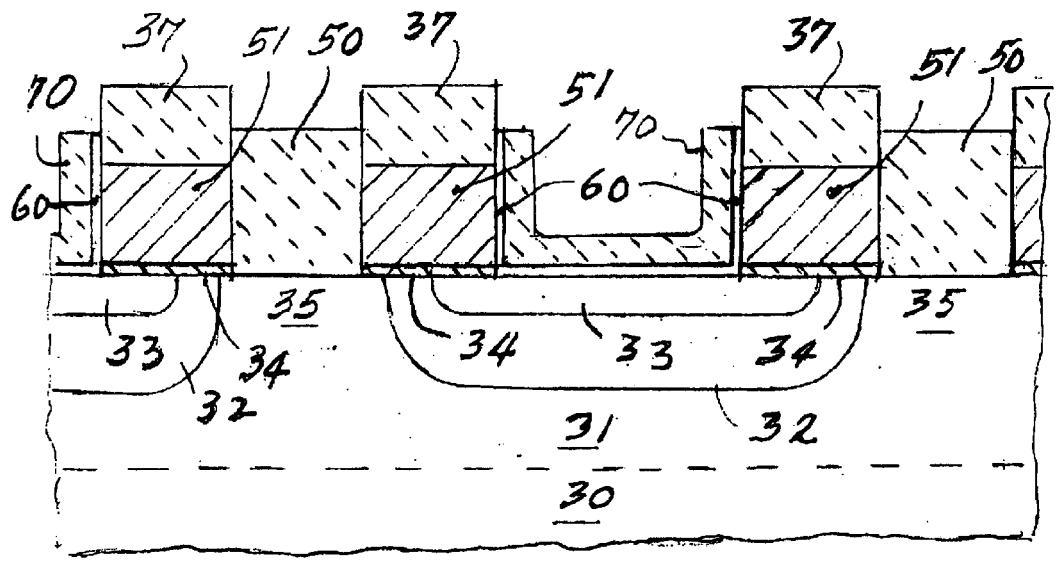
Figure 11:
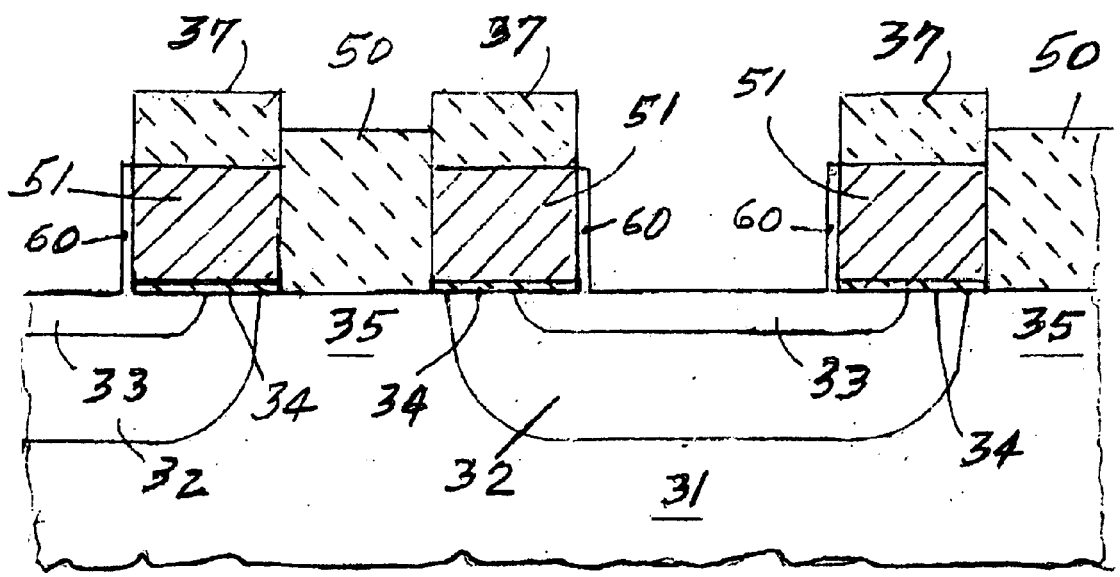

Thereafter, and as shown in FIG. 10, the exposed upper layer of nitride 70 is etched and photoresist 75 is stripped off. A polyoxide 37 is then grown atop poly spacers 51. The remaining nitride film 70 (or the like) is then stripped off as shown in FIG. 11.

Figure 12:
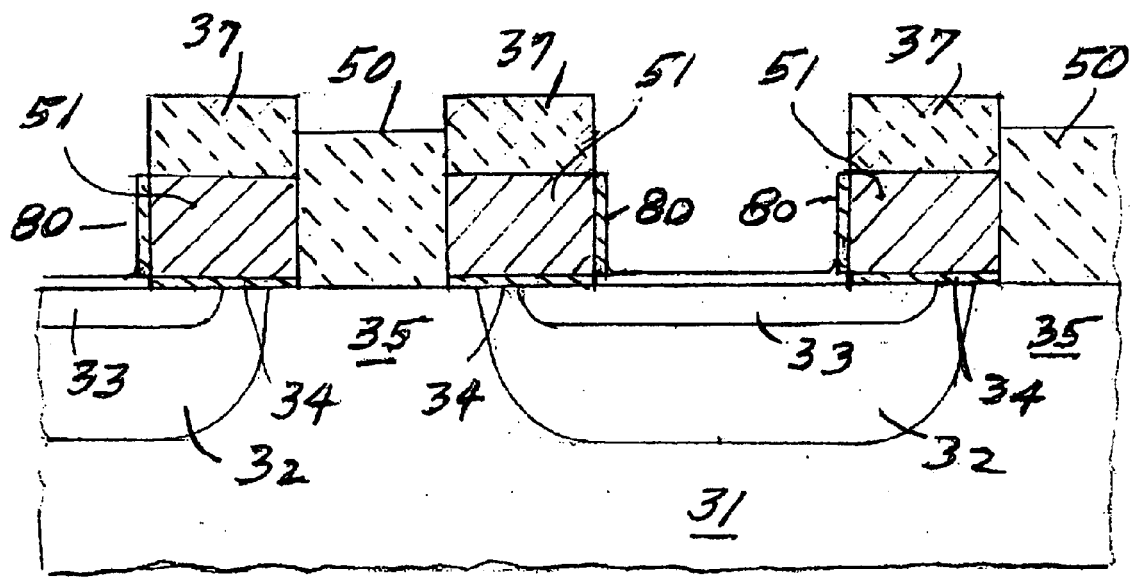

As an option, and if the resistance $R_G$ of the gate is to be further reduced, polysilicide layers 80 may be formed on poly spacers 51 as shown in FIG. 12. In this process, the gap between adjacent spacers 51 is partially filled with an etch protectant, for example, a photoresist, to cover the horizontal oxide surface, but having most of the vertical side walls of spacers 51 unprotected. A short oxide etch is then carried out to remove oxide 60 layer on the side walls of poly spacers 51 and the photoresist is stripped. Polysilicide layer 80, for example, of WSi or the like, is then formed on the bare side walls of spacers 51.

Thereafter, and as shown in FIG. 13, the self-aligned contact process is carried out, in which a conformal oxide layer is deposited atop the die surface and is patterned and etched by a planar oxide etch-back step to leave oxide spacers 38 in place. A silicon trench etch is then carried out to form trenches 40.

As next shown in FIG. 14, the device top surface is patterned and etched to form a polygate contact and the photoresist is again removed. A short oxide etch is then carried out and a metal contact 39 such as aluminum is then deposited atop the wafer. Contact 39 is then appropriately patterned as desired.

The completed device of FIG. 14 will have an extraordinary low $Q_{GD}$ due to the presence of oxide block 50 and the reduced width of polysilicon over the accumulation region 35.

FIGS. 15A to 15C show a modified process flow in which poly spacers 51 are formed by protecting the poly "valleys" with an oxidation blocking film such as $SiN_3$, and then etching the poly and oxidizing and thereby consuming the etched poly. Thus, FIG. 15A shows the silicon in the stage of manufacture of FIG. 6. A layer of silicon nitride 90, or the like (FIG. 15B) is formed over the upper surface. The gaps are filled with a protectant such as a photoresist and the nitride which is exposed is etched and the resist is stripped as shown in FIG. 15B. The exposed polysilicon mesas are then etched to the level of oxide block 50 and polyoxide layers 37 are grown atop the etched surface of the polysilicon 36/51. Nitride 90 is then stripped and the polysilicon is etched and the process is completed as shown in FIGS. 8 to 14.

Figure 16A:
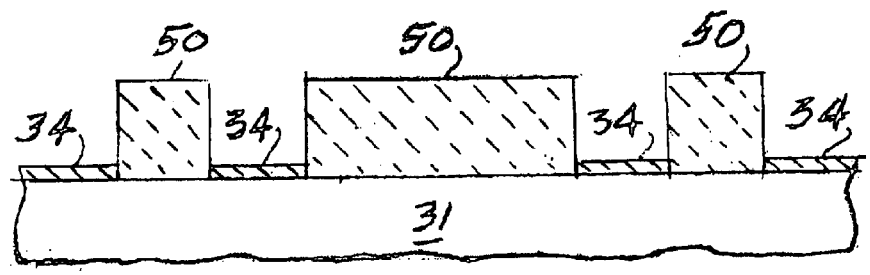
FIGS. 16A to 16D show a still further process flow, employing gap fill for a dual poly spacer MOSFET.
Figure 16B:
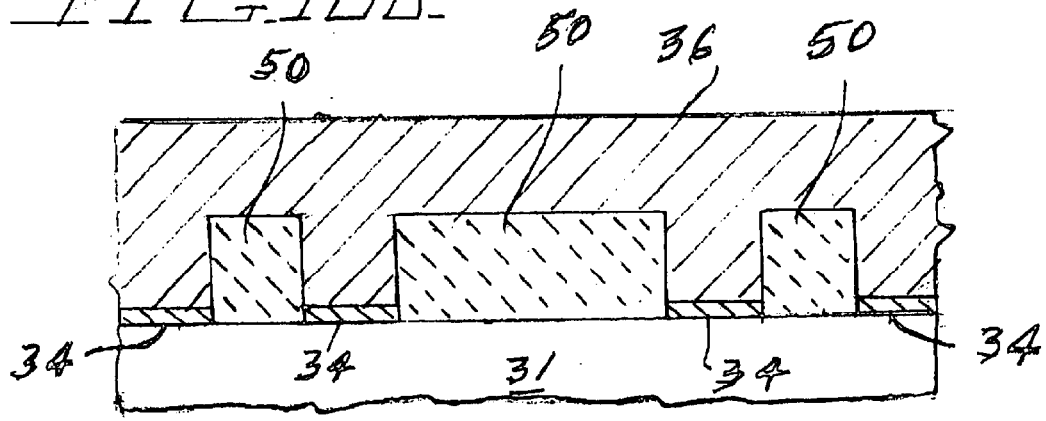
Figure 16C:
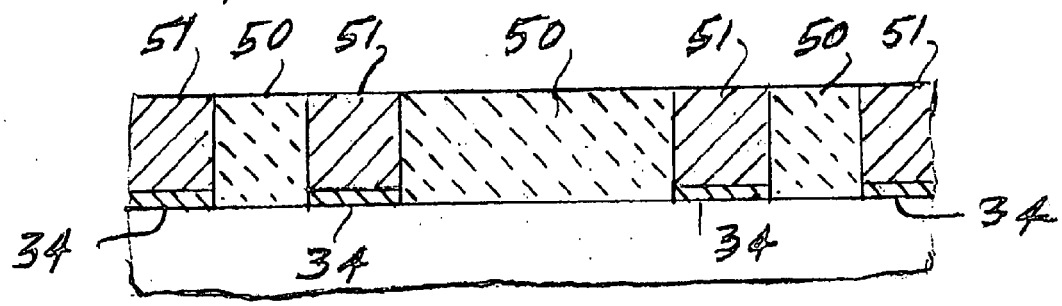

FIGS. 16A to 16D show a still further modified process flow in which the starting thick oxide layer is originally patterned as shown in FIG. 16A to define dual poly gates and cells. A gate oxide 34 is then grown and polysilicon layer 36 is formed to fill the gaps between oxide blocks 50 as shown in FIG. 16B. A planar etch back or CMP step is then carried out to planarize the upper surface as shown in FIG. 16C.

Figure 16D:
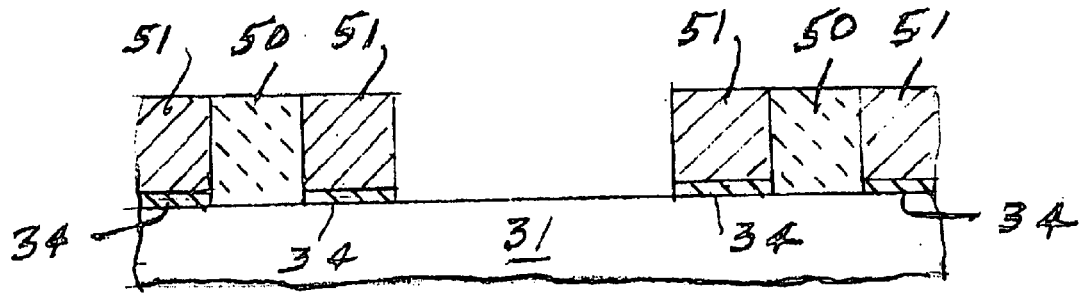

A non-critical alignment step is then carried out to protect oxide block 50 over the accumulation regions and etch the wider oxide block 50 as shown in FIG. 16D. The processing then continues as shown in FIGS. 8 through 14.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power MOSFET with reduced gate capacitance comprising:

a substrate composed of semiconductor material of one conductivity type and having a surface defining a plane;

a plurality of spaced base regions diffused into said surface of said substrate, said base regions having another conductivity type;

source regions diffused into a surface of said base regions, said source regions having said one conductivity type;

a plurality of gate electrode segments, each gate electrode segment being spaced a relatively small distance from an invertible portion of each of said base regions and spaced a relatively large distance from said plane of said substrate between said base regions;

said relatively large distance being approximately 0.5 microns; and a metal source contact insulated from said gate electrode and contacting said source and said base regions.

2. A power MOSFET with reduced gated capacitance comprising:

a substrate with spaced base regions thereon, said substrate and base regions composed of opposite conductive type material, respectively;

a source region in each of said base regions and defining an invertible channel in said base region, said source region having a same conductivity type as said substrate;

a plurality of gate electrodes segments, each gate electrode segment being adjacent to and paired with an invertible channel;

an oxide region over said space between said base regions and having a thickness of about 0.5 microns; and a metal source contact in contact with said source region and said base regions.

3. A power MOSFET with reduced gate capacitance, comprising:

a substrate with a surface defining a plane and having spaced base regions thereon, said substrate and said base regions being of opposite conductivity types;

a source region in each said base region, each said source region defines an invertible channel in said base region;

a gate electrode adjacent each invertible channel, wherein portions of said gate electrodes are distanced from said plane in an area proximate to said spaces between said base regions, whereby an interaction between said gate electrodes and said substrate is decreased;

said distance from said plane to said gate electrode portions being about 0.5 microns; and a metal source contact in contact with said source and said base regions.

4. A power MOSFET according to claim 1 further comprising a thick oxide region occupying said relatively large distance.

5. A power MOSFET according to claim 3 further comprising a thick oxide region occupying said distance.

6. A power MOSFET according to claim 4 wherein said oxide region is over a majority of a dimension of said substrate defined by spaces between said base regions.

7. A power MOSEET according to claim 2 wherein said oxide regions are over a majority of a dimension of said spaces.

8. A power MOSFET according to claim 5 wherein said oxide region is over a majority of a dimension of said spaces.

9. A power MOSFET according to claim 1 further comprising a suicide polysilicon on each of said gate electrodes, thereby decreasing gate resistance.

10. A power MOSFET according to claim 2 further comprising a suicide polysilicon on each of said gate electrodes, thereby decreasing gate resistance.

11. A power MOSFET according to claim 3 further comprising a silicide polysilicon on each of said gate electrodes, thereby decreasing gate resistance.

* * * * *